United States Patent
Doan

[19]

[11] Patent Number: 5,952,050
[45] Date of Patent: Sep. 14, 1999

[54] CHEMICAL DISPENSING SYSTEM FOR SEMICONDUCTOR WAFER PROCESSING

[75] Inventor: Trung T. Doan, Boise, Id.

[73] Assignee: Micron Technology, Inc., Boise, Id.

[21] Appl. No.: 08/944,135

[22] Filed: Oct. 6, 1997

Related U.S. Application Data

[63] Continuation of application No. 08/618,072, Feb. 27, 1996, abandoned.

[51] Int. Cl.$^6$ .............................. B05D 1/26; B05D 3/10; B05D 3/12
[52] U.S. Cl. .............................. 427/336; 118/52; 118/56; 134/33; 134/34; 134/902; 427/240; 427/350; 427/352; 427/294; 438/759; 438/906
[58] Field of Search ...................... 427/350, 336, 427/284, 296, 240, 352, 294; 118/55, 56, 52; 134/33, 34, 902; 222/108, 204; 438/691, 748, 759, 906

[56] References Cited

U.S. PATENT DOCUMENTS

| | | | |
|---|---|---|---|
| 3,834,083 | 9/1974 | Hoshi et al. | 51/57 |
| 4,113,492 | 9/1978 | Sato et al. | 427/336 |
| 4,393,807 | 7/1983 | Fujimura et al. | 427/240 |
| 4,510,176 | 4/1985 | Cuthbert et al. | 427/82 |
| 4,518,678 | 5/1985 | Allen | 427/240 |
| 4,576,796 | 3/1986 | McCormick | 427/4 |
| 4,611,553 | 9/1986 | Iwata et al. | 118/50 |
| 4,668,334 | 5/1987 | Doornveld | 427/240 |
| 4,685,975 | 8/1987 | Kottman et al. | 427/335 |
| 4,732,785 | 3/1988 | Brewer | 427/240 |
| 4,790,262 | 12/1988 | Nakayama et al. | 427/240 |
| 4,838,979 | 6/1989 | Nishida et al. | 156/345 |
| 4,886,728 | 12/1989 | Salamy et al. | 427/336 |
| 4,899,685 | 2/1990 | Kawakami | 118/50 |
| 5,013,586 | 5/1991 | Cavazza | 427/336 |
| 5,103,102 | 4/1992 | Economou et al. | 427/586 |
| 5,151,219 | 9/1992 | Salamy et al. | 252/364 |
| 5,238,713 | 8/1993 | Sago et al. | 427/240 |
| 5,279,926 | 1/1994 | Chandler et al. | 427/240 |
| 5,289,222 | 2/1994 | Hurtig | 118/688 |
| 5,294,257 | 3/1994 | Kelly et al. | 118/503 |
| 5,358,740 | 10/1994 | Bornside et al. | 427/240 |
| 5,362,608 | 11/1994 | Flaim et al. | 430/327 |
| 5,378,511 | 1/1995 | Cardinali et al. | 427/240 |
| 5,444,921 | 8/1995 | Milina | 33/833 |
| 5,474,807 | 12/1995 | Koshiishi | 427/240 |
| 5,580,607 | 12/1996 | Takekuma et al. | 427/384 |
| 5,705,223 | 1/1998 | Bunkofske | 427/385.5 |

FOREIGN PATENT DOCUMENTS 56-73579  11/1979  Japan.

OTHER PUBLICATIONS

Translation of Japanese Document 56–73579, Jun. 18, 1981.

*Primary Examiner*—Diana Dudash

[57] ABSTRACT

A method for dispensing a chemical, such as an edge bead removal solvent, onto a semiconductor wafer comprising the steps of dispensing the chemical selectively onto the wafer and applying a suction to the area immediately surrounding the location at which the chemical is dispensed onto the wafer. Preferably, the suction is applied simultaneously with the dispensing of the chemical. One specific version of the invention provides an edge bead removal system wherein suction is applied to the area immediately surrounding the solvent dispensing nozzle to remove dissolved coating material and excess solvent from the wafer. In one aspect of this system, an apparatus for removing the edge bead includes a mechanism for dispensing a solvent selectively onto the edge of the wafer, and a mechanism surrounding the dispensing mechanism for vacuuming excess solvent and dissolved coating material from the edge of the wafer. The edge bead removal apparatus preferably also includes mechanisms for spinning the semiconductor wafer and coating material on the spinning wafer. Another aspect of the system provides a method for removing an edge bead of a coating of material that has been spun onto the surface of a semiconductor wafer. The method includes the steps of dispensing a solvent selectively onto the edge of the wafer to dissolve the coating material at the extreme edge of the wafer, and applying a suction to vacuum excess solvent and dissolved coating material from the wafer.

28 Claims, 2 Drawing Sheets

CHEMICAL DISPENSING SYSTEM FOR SEMICONDUCTOR WAFER PROCESSING

This application is a continuation of application Ser. No. 08/618,072, filed Feb. 27, 1996 and abandoned on Oct. 6, 1997.

FIELD OF THE INVENTION

The invention relates generally to the manufacture of semiconductor devices. More particularly, the invention relates to a chemical dispensing system for semiconductor wafer processes such as removing the edge bead formed during spin coating processes.

BACKGROUND OF THE INVENTION

Coating materials such as photoresist are typically applied to a semiconductor wafer by flowing liquid coating material onto the top surface of the wafer while it is spinning. The wafer is held on a disk shaped, rotating spin chuck. The diameter of the chuck is slightly less than the diameter of the wafer. The chuck is positioned so that the wafer lies on the chuck in a level horizontal plane. In operation, the backside or inactive surface of the wafer is placed onto the chuck. The chuck applies a suction to the backside of the wafer to hold the wafer in place on the chuck. The chuck is rotated by a motor driven axle that extends down from the chuck. As the wafer is rotated on the chuck, liquid photoresist material is applied to the center of the wafer. The photoresist spreads radially outward from the center of the wafer towards the edge to coat the top of the wafer. Ideally, all excess coating material is ejected from the edge of the wafer. In practice, however, some excess photoresist tends to collect at and form a bead along the edge of the wafer.

A solvent is dispensed along the edge of the wafer to dissolve the edge bead and remove the resist from the extreme edge of the wafer. The solvent may be dispensed through a nozzle directed toward the backside edge of the wafer, in which case it curls up around to the top of the wafer to dissolve the edge bead, or the solvent may be dispensed directly onto the top edge of the wafer. In either case, the process allows solvent and dissolved photoresist to be splashed about and often leaves a jagged edge profile on the photoresist or other coating material.

SUMMARY OF THE INVENTION

Accordingly, it is one object of the invention generally to increase the effectiveness of conventional edge bead removal systems. It is another object to control solvent and particle splashing during the process of removing the edge bead from the coating material. It is a further object of the invention to improve the edge profile of the coating material. These and other objects and advantages may be achieved in general by a method for dispensing a chemical, such as an edge bead removal solvent, onto a semiconductor wafer. The method comprises the steps of dispensing the chemical selectively onto the wafer and applying a suction to the area immediately surrounding the location at which the chemical is dispensed onto the wafer. Preferably, the suction is applied substantially simultaneously with the dispensing of the chemical.

One specific version of the invention provides an edge bead removal system wherein suction is applied to the area immediately surrounding the solvent dispensing nozzle to remove dissolved coating material and excess solvent from the wafer. In one aspect of this system, an apparatus for removing the edge bead includes a mechanism for dispensing a solvent selectively onto the edge of the wafer, and a mechanism surrounding the dispensing mechanism for vacuuming excess solvent and dissolved coating material from the edge of the wafer. The edge bead removal apparatus preferably also includes mechanisms for spinning the semiconductor wafer and coating material on the spinning wafer. Another aspect of the system provides a method for removing an edge bead of a coating of material that has been spun onto the surface of a semiconductor wafer. The method includes the steps of dispensing a solvent selectively onto the edge of the wafer to dissolve the coating material at the extreme edge of the wafer, and applying a suction to vacuum excess solvent and dissolved coating material from the wafer. Preferably, the suction is applied to the area immediately surrounding the location at which the solvent is dispensed onto the wafer simultaneously with the dispensing of the solvent.

DETAILED DESCRIPTION OF THE INVENTION

Figure 1:
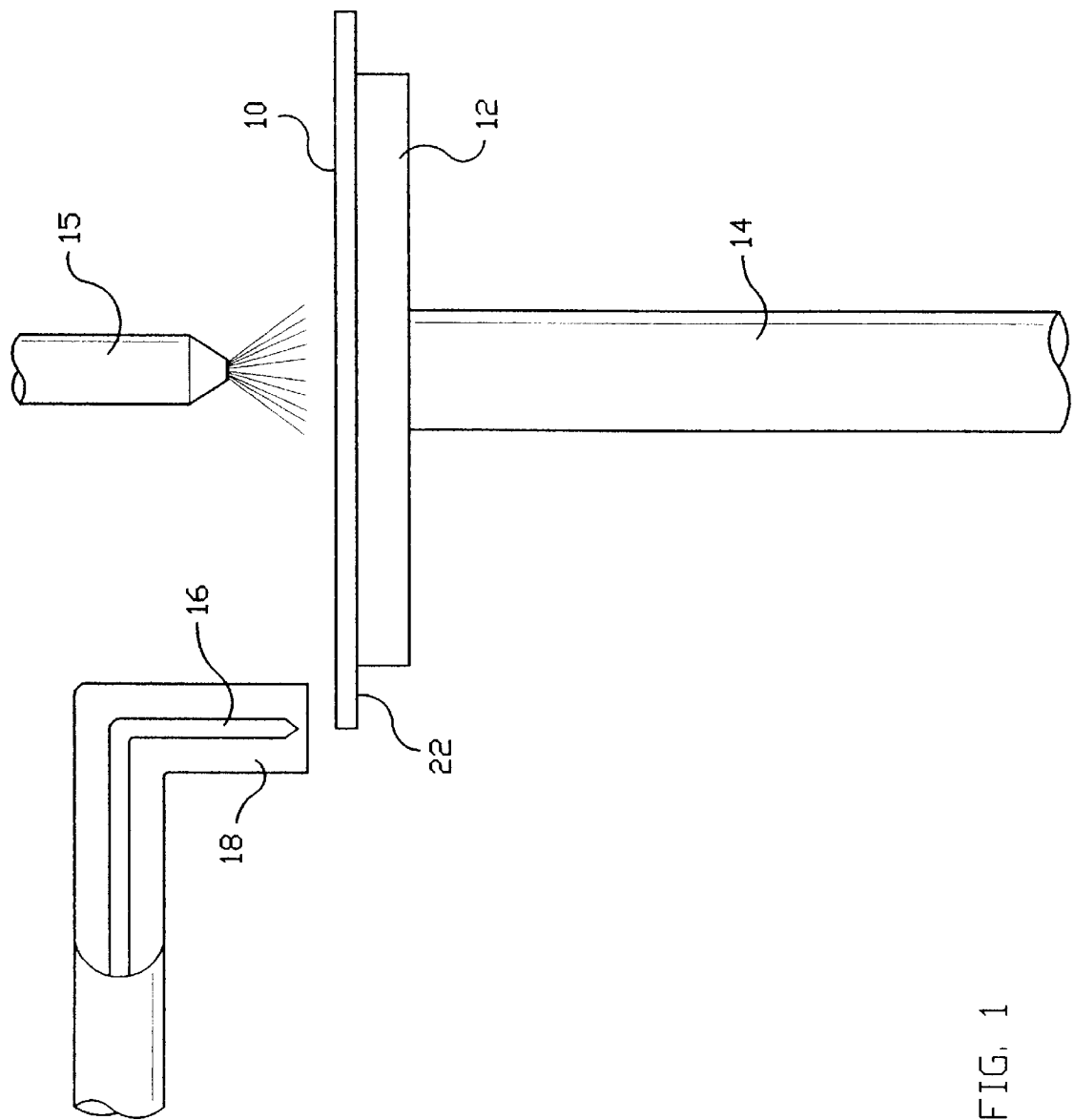
FIG. 1 is a partial side view of a spin coating device having the surrounding suction of the present invention wherein the edge bead removal solvent is dispensed onto the top of the wafer.

Referring to FIG. 1, wafer 10 is positioned on spin chuck 12. Spin chuck 12 is mounted on axle 14. Axle 14 is operatively coupled to a drive mechanism, such as an electric motor (not shown). The diameter of spin chuck 12 is less than the diameter of wafer 10 so that wafer 10 extends beyond the edge of spin chuck 12. a first nozzle 15 for dispensing coating material onto wafer 10 is positioned above and, typically, at the center of wafer 10. A second nozzle 16 for dispensing solvent to dissolve the edge bead is disposed above the edge of wafer 10. Solvent dispensing nozzle 16 is surrounded by vacuum port 18. Vacuum port 18 is operatively coupled to a source of negative pressure, such as a vacuum pump (not shown).

In operation, a suction is applied to the wafer 10 to hold it in place on spin chuck 12. Spin chuck 12 is rotated to spin wafer 10 as a solution of coating material, such as photoresist, is applied through first nozzle 15. Although photoresist is used herein as one illustrative coating, the invention is applicable to any soluble coating. The coating material is distributed across the top surface of wafer 10 largely due to centrifugal forces created by the spinning wafer. Excess coating material tends to collect at and form a bead along the edge 22 of wafer 10. To remove the edge bead, a solvent is sprayed through nozzle 16 onto the edge 22 of wafer 10 to dissolve the coating material at the extreme edge of the wafer. At the same time, the dissolved coating material and excess solvent is suctioned away from wafer 10 through vacuum port 18. Preferably, vacuum port 18 surrounds nozzle 16 and a suction is thereby applied to the area immediately surrounding nozzle 16, as shown in FIG. 1. Also, vacuum port 1 8 preferably moves with nozzle 16 as it is extended and retracted into position over wafer 10. This "surround vacuum" controls solvent and particle splashing during the process of removing the edge bead from the coating material. In addition, it is believed the surround vacuum improves the edge profile of the coating material.

Figure 2:
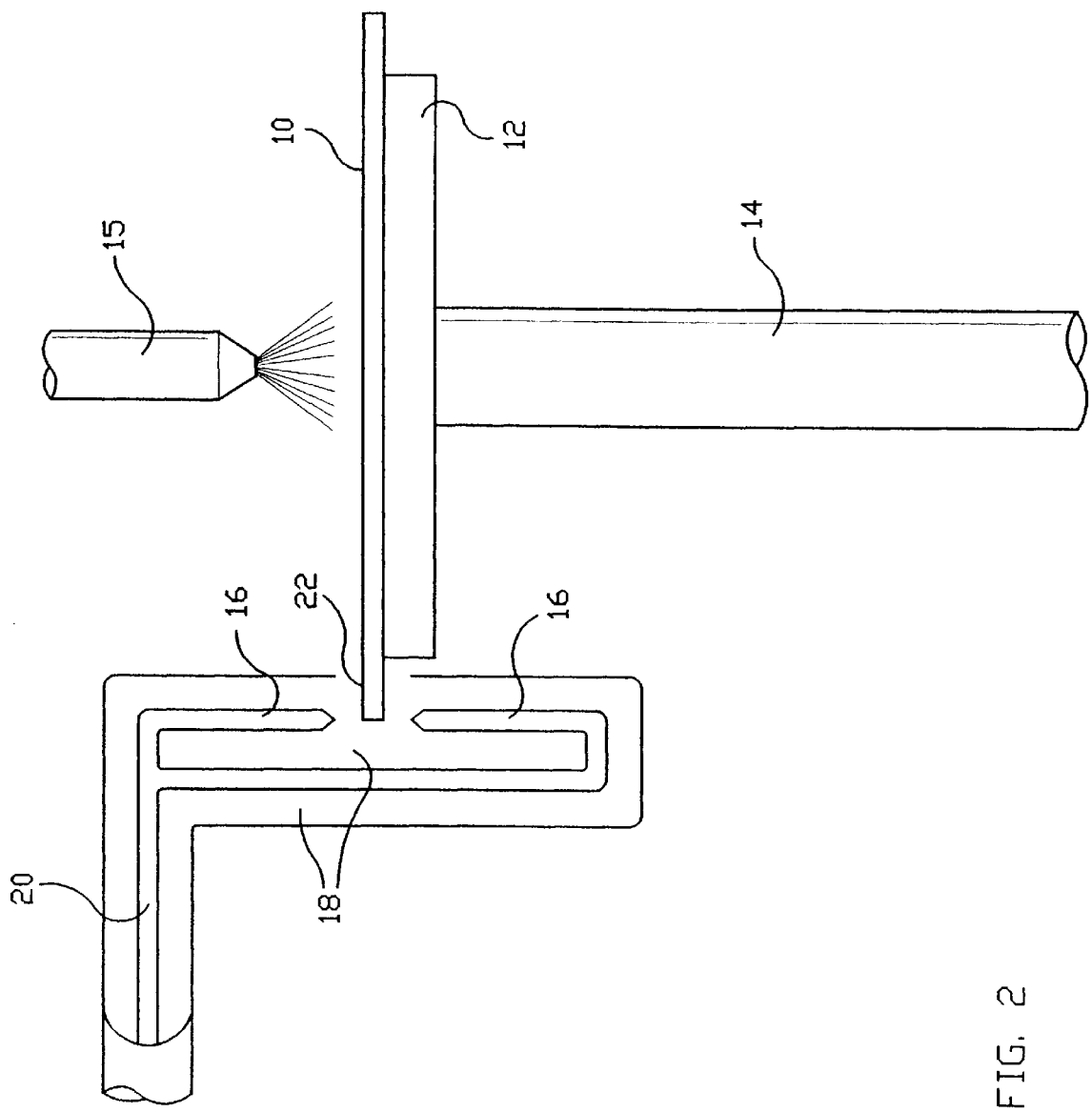
FIG. 2 is a partial side view of a spin coating device having the surrounding suction of the present invention wherein the edge bead removal solvent is dispensed onto both the top and bottom of the wafer.

FIG. 2 illustrates a second embodiment of the invention wherein the solvent is applied to both the top and bottom surfaces of wafer 10. Wafer 10 is positioned on spin chuck 12 which is rotated on axle 14. An edge bead removal solvent is supplied through tubes 20 to dispensing nozzles 16. The solvent is sprayed through nozzles 16 onto the edge 22 of wafer 10 and, at the same time, the dissolved coating material and excess solvent is suctioned away through vacuum ports 18.

Conventional spin coating machines, such as a SVG Coat Track or TEL Mark 8, can be adapted for use in accordance with the invention as described herein. With the exception of the vacuum ports, the above described components are conventional and well known to those skilled in the art. There has been shown and described an edge bead removal system wherein a suction is applied to the area surrounding the solvent dispensing nozzle to control splashing and improve the edge profile of the coating material. The particular embodiments shown and described herein are for purposes of example and should not be construed to limit the invention as set forth in the appended claims.

What is claimed is:

1. A method for removing an edge bead of a coating of material that has been spun onto the surface of a semiconductor wafer, the method comprising the steps of:
   a. dispensing a solvent selectively onto the edge of the wafer to dissolve the coating material at the edge of the wafer; and
   b. applying a suction locally to the edge of the wafer to vacuum excess solvent and dissolved coating material from the edge of the wafer.

2. A method for removing an edge bead of a coating of material that has been spun onto the surface of a semiconductor wafer, the method comprising the steps of:
   a. dispensing a solvent selectively onto the edge of the wafer; and
   b. applying a suction locally to an area immediately surrounding a location at which the solvent is dispensed onto the wafer.

3. A method for removing an edge bead of a coating of material that has been spun onto the surface of a semiconductor wafer, the method comprising the steps of:
   a. dispensing a solvent selectively onto the edge of the wafer; and
   b. simultaneously applying a suction locally to the edge of the wafer.

4. A method for spin coating a semiconductor wafer with a soluble material, comprising the steps of:
   a. spinning the semiconductor wafer;
   b. applying a coating material to the spinning wafer;
   c. dispensing a solvent selectively onto the edge of the wafer to dissolve the coating material at the edge of the wafer; and
   d. applying a suction locally to the edge of the wafer to vacuum excess solvent and dissolved coating material from the edge of the wafer.

5. A method for spin coating a semiconductor wafer with a soluble material, comprising the steps of:
   a. spinning the semiconductor wafer;
   b. applying a coating material to the spinning wafer;
   c. dispensing a solvent selectively onto the edge of the wafer to dissolve the coating material at the edge of the wafer; and
   d. applying a suction locally to an area immediately surrounding a location at which the solvent is dispensed onto the wafer.

6. A method for spin coating a semiconductor wafer with a soluble material, comprising the steps of:
   a. spinning the semiconductor wafer;
   b. applying a coating material to the sDinning wafer;
   c. dispensing a solvent selectively onto the edge of the wafer; and
   d. applying a suction locally to the edge of the wafer simultaneously with the step of dispensing the solvent.

7. A method of dispensing a chemical onto a semiconductor wafer, comprising the steps of:
   a. spinning the semiconductor wafer;
   b. applying a coating material to the spinning wafer;
   c. dispensing the chemical selectively onto the wafer;
   d. applying a suction locally to an area immediately surrounding a location at which the chemical is dispensed onto the wafer.

8. A method according to claim 7, wherein the suction is applied simultaneously with the dispensing of the chemical.

9. A method of removing a chemical that is dispensed from a nozzle to a first portion of a workpiece, comprising:
   generating a first gas pressure within a device, wherein said first gas pressure is different from a second gas pressure at a second portion of said workpiece, and wherein said first gas pressure is in fluid communication with said second gas pressure;
   aligning said device with said nozzle along a common longitudinal axis;
   maintaining a distance between said device and said workpiece; and
   exposing said chemical to said first pressure.

10. The method in claim 9, wherein said step of generating a first gas pressure further comprises generating a first gas pressure that is lower than said second gas pressure.

11. The method in claim 10, wherein said step of aligning said device comprises positioning said device around said nozzle.

12. A method of processing a workpiece having a solution on an end of said workpiece, comprising:
   encompassing only said end of said workpiece with a solution removal device; and
   drawing said solution through said solution removal device.

13. The method in claim 12, wherein said step of drawing said solution further comprises sucking said solution through said solution removal device.

14. A method of profiling a coating on an edge of a substrate, comprising:
   positioning at least one dispenser near said edge;
   surrounding said at least one dispenser with a vacuum mechanism;
   sending a solvent in a direction out of said at least one dispenser, beyond said vacuum mechanism, and to said coating; and
   pulling said solvent from said edge in a generally opposite direction toward said vacuum mechanism.

15. The method in claim 14, wherein said step of positioning at least one dispenser further comprises:
   positioning a first dispenser toward a first side of said substrate, wherein said first side extends to said edge; and
   positioning a second dispenser toward a second side of said substrate, wherein said second side extends to said edge.

16. The method in claim 15, wherein said step of positioning at least one dispenser further comprises:
   positioning said first dispenser over said first side; and
   positioning said second dispenser under said second side.

17. The method in claim 16, wherein said step of positioning said second dispenser further comprises aligning said second dispenser against said first dispenser.

18. The method in claim 17, further comprising:
   moving said at least one dispenser away from said substrate after pulling said solvent; and
   moving said vacuum mechanism with said at least one dispenser.

19. A method of controlling splashing from a liquid sprayed on a coating of a surface, comprising:
   providing a nozzle having a dispensing point;
   applying a suction around said dispensing point; and
   dispensing a liquid from said dispensing point with a force sufficient to overcome said suction.

20. The method in claim 19, wherein said step of opposing said suction further comprises diametrically opposing said suction with said liquid.

21. The method in claim 20, further comprising:
   dissolving said coating with said liquid into at least one particle;
   allowing said particle to move away from said surface; and
   directing said particle with said suction.

22. The method in claim 21, further comprising:
   allowing a solution comprising said particle and said liquid to move away from said surface; and
   allowing said solution to move with said suction.

23. The method in claim 22, wherein said step of allowing said liquid to move away from said surface further comprises spinning said surface.

24. A method of processing a wafer, comprising:
   providing a vacuum device having an orientation toward said wafer;
   defining an axis with said orientation; and
   dispersing a fluid from said vacuum device generally along said axis.

25. The method in claim 24, further comprising:
   contacting said wafer with said fluid; and
   pulling said fluid from said wafer generally along said axis.

26. The method in claim 25, wherein said step of pulling said fluid further comprises pulling said fluid into said vacuum device.

27. The method in claim 26, wherein said step of dispersing a fluid further comprises:
   providing a dispenser having a dispensing location within said vacuum device; and
   distributing said fluid from said dispenser at said dispensing location.

28. The method in claim 27, wherein said step of dispersing a fluid comprises aligning said dispenser along said axis.

* * * * *

UNITED STATES PATENT AND TRADEMARK OFFICE
CERTIFICATE OF CORRECTION

PATENT NO. : 5,952,050

DATED : September 14, 1999

INVENTOR(S) : Trung T. Doan

It is certified that error appears in the above-identified patent and that said Letters Patent is hereby corrected as shown below:

At column 2, line 62, replace "1 8" with --18--.
At column 4, line 4 (claim 6), replace "sDinning" with -- spinning --.

Signed and Sealed this

First Day of February, 2000

Attest:

Attesting Officer

Q. TODD DICKINSON

Acting Commissioner of Patents and Trademarks